United States Patent
Shin et al.

(10) Patent No.: US 8,220,149 B2
(45) Date of Patent: Jul. 17, 2012

(54) METHOD OF MANUFACTURING A PRINTED CIRCUIT BOARD

(75) Inventors: Hee-Bum Shin, Seoul (KR); Jeong-Ho Moon, Suwon-si (KR); Jae-Hyun Eom, Gyeongsangbuk-do (KR); Jee-Soo Mok, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 937 days.

(21) Appl. No.: 12/230,101

(22) Filed: Aug. 22, 2008

(65) Prior Publication Data

US 2009/0205862 A1    Aug. 20, 2009

(30) Foreign Application Priority Data

Feb. 18, 2008    (KR) .................. 10-2008-0014405

(51) Int. Cl.
    *H01K 3/10*    (2006.01)
(52) U.S. Cl. ............... 29/852; 29/830; 174/262; 216/18
(58) Field of Classification Search .................. 174/262; 216/18, 38, 52, 65; 427/97.2; 430/313–318; 438/629, 637, 692, 699; 29/830, 846, 852
    See application file for complete search history.

(56) References Cited

U.S. PATENT DOCUMENTS

| | | | | |
|---|---|---|---|---|
| 4,642,160 A | * | 2/1987 | Burgess | 29/852 |
| 5,266,446 A | * | 11/1993 | Chang et al. | 438/692 |
| 5,759,911 A | * | 6/1998 | Cronin et al. | 438/637 |

FOREIGN PATENT DOCUMENTS

KR    10-2006-0064309    6/2006

* cited by examiner

*Primary Examiner* — Donghai D. Nguyen (57) ABSTRACT

A printed circuit board and a method of manufacturing the printed circuit board are disclosed. The printed circuit board can include a first insulation layer, a second insulation layer stacked over the first insulation layer, a circuit pattern and a via land buried in the second insulation layer, and a via made of a conductive material penetrating the first insulation layer and integrated with the via land. The circuit pattern and via land can be buried in the insulation material, and the circuit pattern, via land, and via can be formed simultaneously as an integrated structure. Thus, the electrical reliability between the wiring pattern and the via can be increased, the heat-releasing effect of the via can be improved, and the procedure for forming the circuit patterns, via lands, and vias can be simplified, allowing greater productivity in manufacturing the substrate.

6 Claims, 10 Drawing Sheets

METHOD OF MANUFACTURING A PRINTED CIRCUIT BOARD

CROSS-REFERENCE TO RELATED APPLICATIONS

This application claims the benefit of Korean Patent Application No. 10-2008-0014405 filed with the Korean Intellectual Property Office on Feb. 18, 2008, the disclosure of which is incorporated herein by reference in its entirety.

BACKGROUND

1. Technical Field

The present invention relates to a printed circuit board and to a method of manufacturing the printed circuit board.

2. Description of the Related Art

In the related art, a method of manufacturing a printed circuit board that has conductive vias between layers and circuit patterns on the outer layers may include forming circuit patterns over a core substrate and forming vias that penetrate the core substrate, and then forming stack-vias.

According to the related art, via holes may be formed by drilling through the core substrate, and a plating layer may be formed over the inner wall of each of the via holes, after which the insides of the via holes may be filled in with an insulating resin. The vias may be formed by applying cap plating over both sides of the resin-filled via holes. Then, insulating materials may be stacked on and stack-vias may be formed in the same manner, to electrically connect the outer and inner layers. A process for forming wiring patterns may be required after forming the vias.

As such, a method of manufacturing a printed circuit board according to the related art may require numerous processes, such as mechanical drilling, plating the via holes, filling with an insulating resin, and applying cap plating, resulting in a complicated manufacturing procedure and increased costs.

Moreover, in a printed circuit board manufactured according to the related art, the adhesion may be degraded at the interface between the insulating resin filled in the vias and the cap plating, and there is a risk of voids or dimples occurring during the process of filling the insulating resin.

SUMMARY

An aspect of the invention provides a printed circuit board, and a method of manufacturing the printed circuit board, which offer higher reliability in the circuit patterns, via lands, and vias, and allow a simple manufacturing procedure.

Another aspect of the invention provides a printed circuit board that includes a first insulation layer, a second insulation layer stacked over the first insulation layer, a circuit pattern and a via land buried in the second insulation layer, and a via made of a conductive material penetrating the first insulation layer and integrated with the via land.

Yet another aspect of the invention provides a method of manufacturing a printed circuit board in which a circuit pattern and a via land are formed, where the method includes providing a first insulation layer, stacking a second insulation layer made of a photosensitive material over the first insulation layer, processing, a via hole penetrating the first insulation layer and the second insulation layer, transcribing a contour of the circuit pattern and the via land into the second insulation layer, and forming a conductive material inside the contour of the circuit pattern and the via land and inside the via hole.

The operation of processing the via hole described above can be performed by perforating the first insulation layer and the second insulation layer using a drilling process.

Also, the operation of transcribing the contour of the circuit pattern and the via land into the second insulation layer can include selectively exposing the second insulation layer to light, and selectively removing the second insulation layer by supplying a developer. Here, selectively exposing the second insulation layer to light can be performed by stacking a mask over the second insulation layer to expose a portion of the second insulation layer to light.

The operation of forming the conductive material inside the contour of the circuit pattern and the via land and inside the via hole can include forming a seed layer over the first insulation layer, the second insulation layer, and an inner wall of the via hole by electroless plating, forming the conductive material over the seed layer by electroplating, and etching the conductive material such that the second insulation layer is exposed.

Also, the etching of the conductive material can include half-etching the conductive material by supplying an etchant or removing a portion of the conductive material by polishing.

Additional aspects and advantages of the present invention will be set forth in part in the description which follows, and in part will be obvious from the description, or may be learned by practice of the invention.

DETAILED DESCRIPTION

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

While such terms as "first," "second," etc., may be used to describe various elements, such elements must not be limited to the above terms. The above terms are used only to distinguish one element from another.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

The printed circuit board and method of manufacturing the printed circuit board according to certain embodiments of the invention will be described below in more detail with reference to the accompanying drawings. Those elements that are the same or are in correspondence are rendered the same reference numeral regardless of the figure number, and redundant explanations are omitted.

A method of manufacturing a printed circuit board according to an embodiment of the invention will be described as follows with reference to FIG. 1 through FIG. 9.

Figure 1:
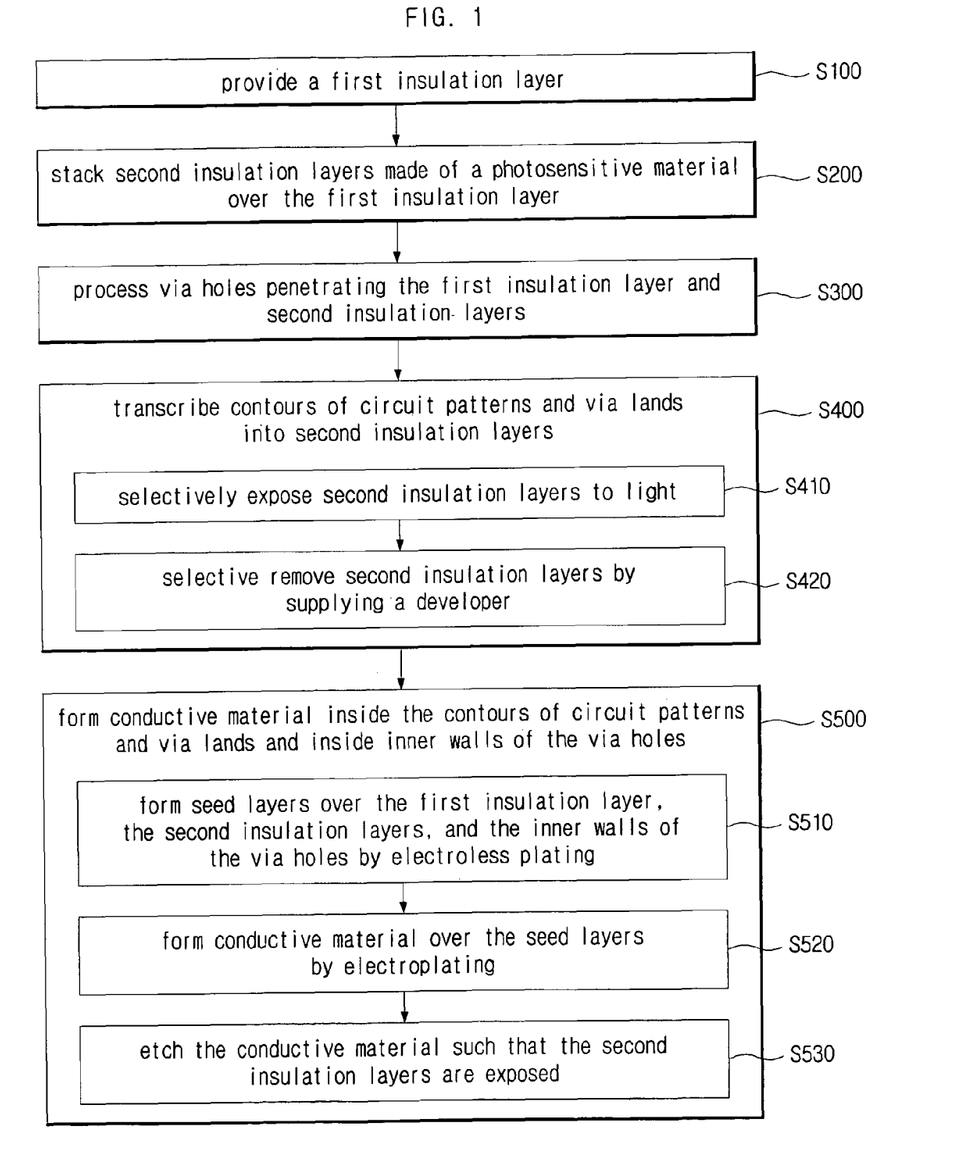
FIG. 1 is a flowchart illustrating a method of manufacturing a printed circuit board according to an embodiment of the invention.

FIG. 1 is a flowchart illustrating a method of manufacturing a printed circuit board according to an embodiment of the invention, while FIG. 2 through FIG. 9 are cross sectional views representing a flow diagram for a method of manufacturing a printed circuit board according to an embodiment of the invention. In FIGS. 2 to 9, there are illustrated a first insulation layer 10, second insulation layers 20, circuit patterns 32, via lands 34, contours 36 of the circuit patterns and via lands, vias 40, via holes 50, conductive material 60, seed layers 62, masks 64, and light 66.

Figure 2:
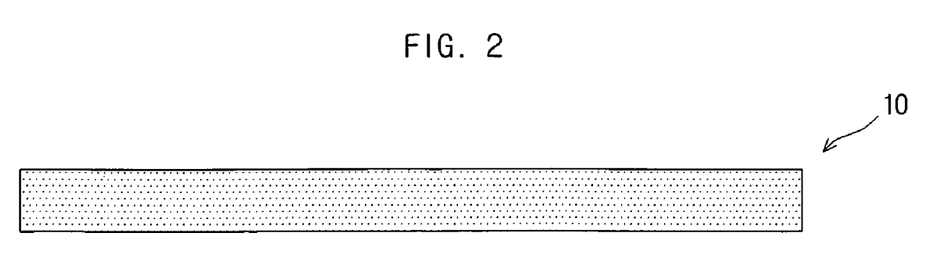
FIG. 2, FIG. 3, FIG. 4, FIG. 5, FIG. 6, FIG. 7, FIG. 8, and FIG. 9 are cross sectional views representing a flow diagram for a method of manufacturing a printed circuit board according to an embodiment of the invention.
Figure 3:
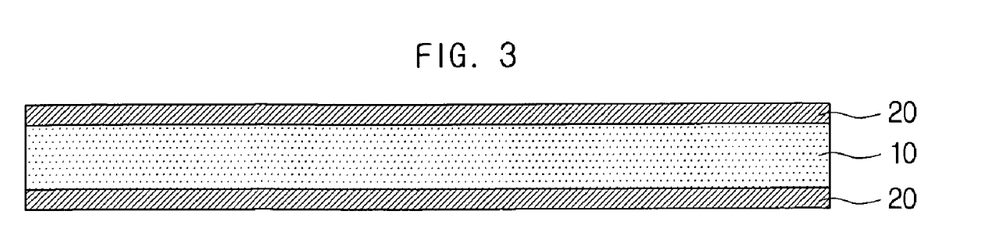

First, as in the example shown in FIG. 2, a first insulation layer 10 can be provided (S100), and as illustrated in FIG. 3, second insulation layers 20 made of a photosensitive material can be stacked over the first insulation layer 10 (S200).

The first insulation layer 10 can serve to provide and maintain electrical insulation, mechanical strength and rigidity, and dimensional stability in the substrate.

The second insulation layer 20 stacked over the inner first insulation layer 10 and made of a photosensitive material can be such that is selectively hardened when irradiated with light such as ultraviolet rays, etc. In certain examples, the second insulation layer 20 can be made mainly of a reactive modified acrylic resin serving as the main resin and an epoxy resin serving as a hardening agent, and can also include acrylic monomers, inorganic fillers, polymerization initiators, accelerators, solvents, and other additives.

Figure 4:
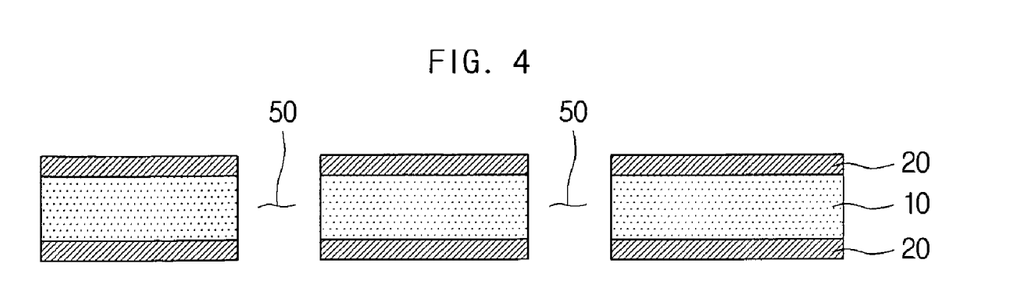

Next, as in the example shown in FIG. 4, via holes 50 can be processed which penetrate the first insulation layer 10 and the second insulation layers 20 (S300). In certain embodiments of the invention, the via hole 50 can be processed using a drilling process to perforate the first insulation layer 10 and second insulation layers 20.

In the description of certain embodiments of the invention, a via hole 50 may refer to a processed hole formed in the first insulation layer 10 and second insulation layers 20, as a preliminary phase to implementing interlayer conduction in the substrate. A via 40, on the other hand, may refer to the passage for interlayer conduction implemented by forming a conductive material inside the via hole 50.

Figure 5:
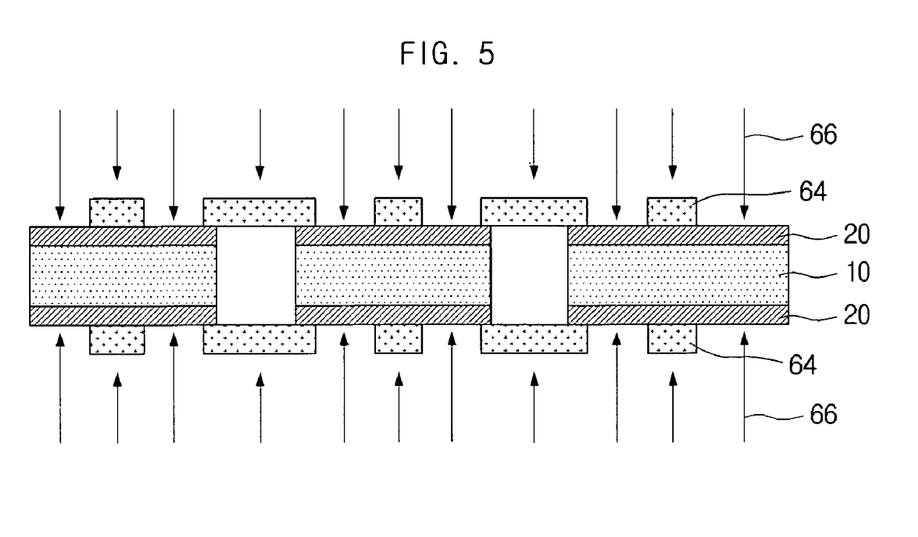
Figure 6:
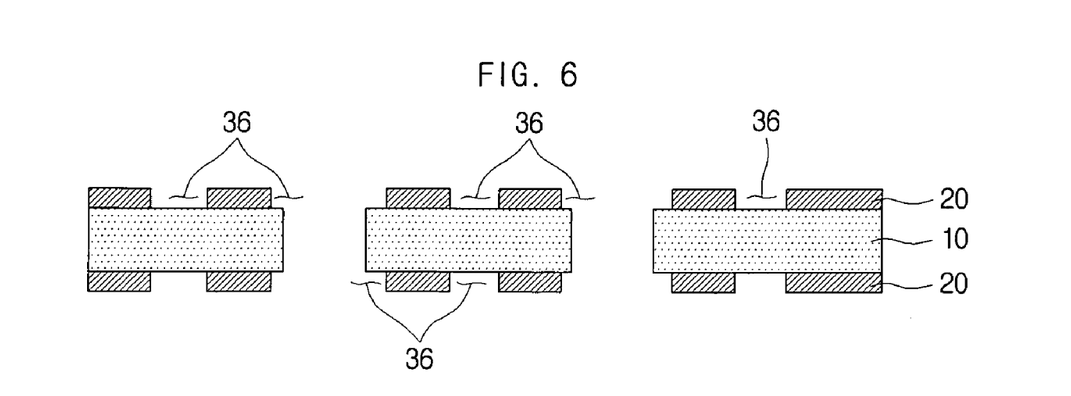

Next, as illustrated in FIG. 5 and FIG. 6, the contours 36 of circuit patterns and via lands can be transcribed into the second insulation layers 20 (S400). In certain examples, transcribing the contour 36 of the circuit pattern and via lands into the second insulation layer 20 can be performed as follows.

First, the second insulation layer 20 can be selectively exposed to light (S410), as in the example shown in FIG. 5. According to this embodiment, the operation of selectively exposing the second insulation layer 20 to light may be performed, as illustrated in FIG. 5, by stacking a mask 64 over the second insulation layer 20 that includes the contour 36 of the circuit pattern and via lands, to expose portions of the second insulation layer 20 to light.

It is also possible to selectively expose the second insulation layer 20 to light by stacking an artwork film, in which the contour 36 of the circuit patterns and via lands are formed, over the second insulation layer 20.

Afterwards, as illustrated in FIG. 6, a developer can be supplied to selectively remove the second insulation layer 20 (S420). In this particular embodiment, portions of the second insulation layer 20 that are not covered by the mask 64 and are hence exposed to light 66, i.e. ultraviolet rays, as in FIG. 5 may be hardened. Portions of the second insulation layer 20 that are covered by the mask 64 and are not exposed to the light 66 may be selectively removed by supplying a developer.

By applying a developing process to remove portions of the second insulation layer 20, the contour 36 of the circuit pattern and via lands can be transcribed into the second insulation layer, as in the example shown in FIG. 6.

Figure 7:
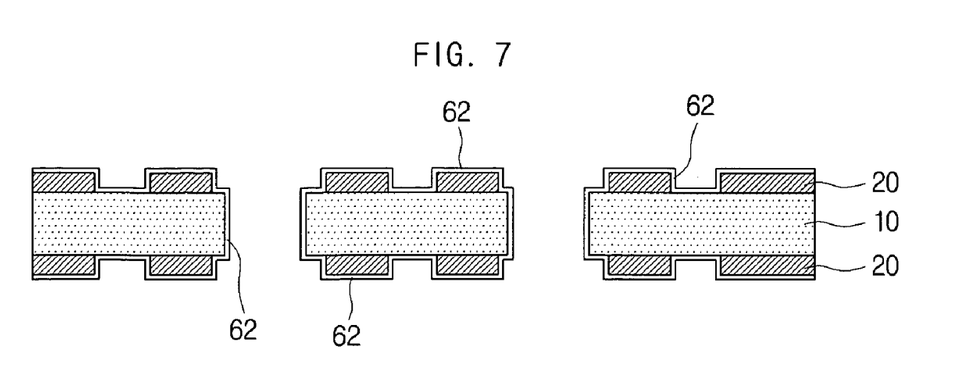
Figure 8:
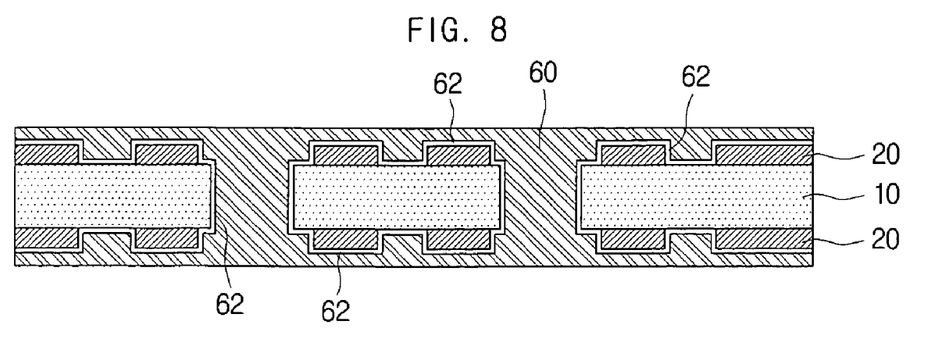
Figure 9:
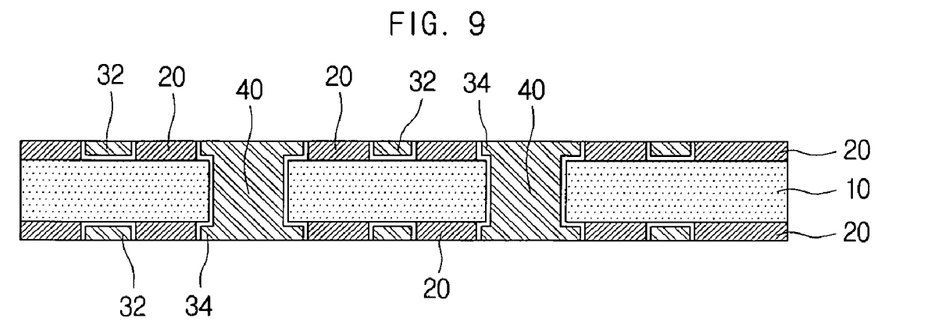

Next, as illustrated in FIG. 7 through FIG. 9, a conductive material can be formed inside the contours 36 of the circuit patterns and via lands and inside the via holes 50 (S500). In certain examples, forming the conductive material inside the contour 36 of the circuit pattern and via lands and inside the via holes 50 can be performed as follows.

As illustrated in FIG. 7, a seed layer can be formed over the first insulation layer 10, the second insulation layer 20, and the inner walls of the via holes 50 (S510). The seed layer 62 illustrated in FIG. 7 can be formed over the first insulation layer 10, the second insulation layer 20, and the inner walls of the via holes 50 using an electroless chemical plating method. The seed layer 62 may serve as the foundation on which to form the conductive material, in the subsequent electroplating operation described later.

Afterwards, as illustrated in FIG. 8, the conductive material 60 can be formed over the seed layer 62 by electroplating (S520). Because of the seed layers 62 formed over the first insulation layer 10 and the second insulation layers 20, which form the substrate, and over the inner walls of the via holes 50, the conductive material 60 can be formed over the first insulation layer 10, the second insulation layers 20, and the inner walls of the via holes 50 as in FIG. 8 using an electroplating process. The conductive material 60 can be a material containing copper (Cu), typically used for electroplating.

In this particular embodiment, the conductive material 60 illustrated in FIG. 8 can be formed as an integrated structure, during the electroplating process, over all of the surfaces of the substrate at the same time.

Next, as illustrated in FIG. 9, the conductive material 60 can be etched in such a way that the second insulation layer 20 is exposed (S530). As illustrated in FIG. 9, the conductive material 60 completely covering the outer layer of the substrate can be etched such that the second insulation layer 20 is exposed, whereby a circuit pattern 32 and via lands 34 may be formed in the outer layer of the substrate.

In the description of certain embodiments of the invention, a via land may refer to a portion of the wiring line that is formed wider at a position where a via is connected to a circuit pattern.

When the conductive material 60 on the outer layer of the substrate is generally etched as in FIG. 9, portions of the conductive material buried in the second insulation layer 20 may remain. The remaining conductive material buried in the second insulation layer 20 may become the circuit pattern 32 and the via lands 34. That is, according to this embodiment, a circuit pattern 32 and via lands 34 buried in the second insulation layer 20 can be obtained by etching portions of the conductive material 60 in such a way that the second insulation layer 20 is exposed.

Here, the etching of the conductive material 60 to expose the second insulation layers 20 can be performed by half-etching the conductive material 60 by supplying an etchant. The etchant can lower the height of the conductive material formed on the outer layer of the substrate, so that the second insulation layer 20 may be exposed.

The operation of etching the conductive material 60 to expose the second insulation layer 20 can also be performed by using a polishing process to remove portions of the conductive material 60. A buffing operation can be applied to the relatively thick conductive material formed over the outer layer of the substrate, to lower the height of the conductive material and expose the second insulation layer 20.

The circuit pattern 32 and via lands 34 illustrated in FIG. 9 can be formed buried in the second insulation layer 20. Also, as in the example shown in FIG. 9, the vias 40 formed at the same time as the circuit patterns 32 and via lands 34 during the process for forming the conductive material 60 may be implemented as integrated structures with the via lands 34.

In a method of manufacturing a printed circuit board according to this embodiment, the circuit patterns 32, via lands 34, and vias 40 can be formed simultaneously as an integrated structure during the procedure of forming the conductive material 60. As such, the method of manufacturing a printed circuit board according to this embodiment can entail a simpler manufacturing procedure compared to other methods based on the related art, which may include processes such as plating the inner walls of the vias, filling the insides of the vias with an insulating resin, and applying cap plating over the upper and lower sides of the vias.

Therefore, the method of manufacturing a printed circuit board described above can be utilized to simplify the manufacturing procedure and increase productivity. Since there is no process for filling the insides of the vias with an insulating resin, voids and dimples can be prevented, which may otherwise occur when filling the insulating resin. This embodiment can also be used to provide a printed circuit board that offers reliable electrical connection in the circuit patterns 32, via lands 34, and vias 40, and allows exceptional heat release.

A printed circuit board according to an embodiment of the invention will be described as follows.

Figure 10:
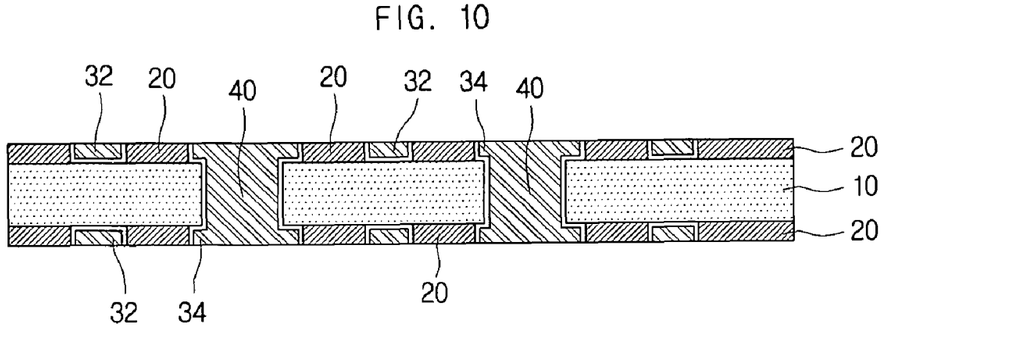
FIG. 10 is a cross sectional view of a printed circuit board according to an embodiment of the invention.

FIG. 10 is a cross sectional view of a printed circuit board according to an embodiment of the invention. In FIG. 10, there, are illustrated a first insulation layer 10, second insulation layers 20, circuit patterns 32, via lands 34, and vias 40.

FIG. 10 illustrates a printed circuit board, which may include a first insulation layer 10 that forms the inner layer of the substrate, second insulation layers 20 stacked over the first insulation layer 10, circuit patterns 32 and via lands 34 formed buried in the second insulation layers 20, and vias 40 made of a conductive material that penetrate the first insulation layer 10 and form integrated structures with the via lands 34.

The first insulation layer 10 may be arranged at the center of the substrate and may serve as the inner substrate. The first insulation layer 10 can provide and maintain electrical insulation, mechanical strength and rigidity, and dimensional stability in the substrate.

According to an embodiment of the invention, the second insulation layer 20 may be stacked over the first insulation layer 10 and may include a contour of the circuit pattern 32 and via lands 34 that are formed on the outer layer of the substrate.

In the description of certain embodiments of the invention, a via land may refer to a portion of the wiring line that is formed wider at a position where a via is connected to a circuit pattern.

The circuit pattern 32 and via lands 34 can be formed buried in the second insulation layer 20 that includes the contour of the circuit pattern 32 and via lands 34. In other words, an electrical wiring layer that has the circuit pattern 32 and via lands 34 buried in the second insulation layer 20 can be arranged on the outer layer of the substrate.

According to this embodiment, circuit patterns 32 and via lands 34 can be formed as buried structures in the second insulation layers 20, whereby the circuit patterns 32 and via lands 34 can be made with improved electrical reliability. As the circuit pattern 32 and via lands 34 are buried in the second insulation layer 20, with portions of the second insulation layer 20 positioned between the circuit pattern 32 and the via lands 34, the occurrence of bridges or short-circuiting problems, which may occur when the circuit pattern 32 and the via lands 34 undergo thermal expansion due to the high levels of heat generated by electrical components, etc., can be avoided.

Furthermore, due to the electrical reliability described above, the circuit patterns 32 and via lands 34 can be provided with reduced pitch, making it possible to form the circuit patterns 32 and via lands 34 in a high density.

As illustrated in FIG. 10, according to an embodiment of the invention, vias 40 made of a conductive material can be formed to penetrate the first insulation layer 10 and be integrated with the via lands 34.

In an embodiment of the invention, the via 40, which may penetrate the first insulation layer 10 to enable interlayer conduction between the electrical wiring layers formed on the outer layers of the substrate, can be formed as an integrated structure with the via lands 34. Thus, in this embodiment, interfaces may not be present between the via lands 34 on either side of the substrate and the via 40 that connects the via lands 34.

The via lands 34 and via 40 can be formed not as separate conductive structures connected together, but rather as an integrated structure made from a conductive material in a single process. As such, there may not be any interfaces between the via lands and the via.

Thus, with this embodiment of the invention, problems of cracking in the interfaces between the vias and wiring patterns, which may occur when using the conventional method of forming a plating material over the inner walls of the vias, filling with insulating resin, and applying cap plating over the upper and lower sides of the vias, can be reduced or eliminated.

Also, the via 40 according to an embodiment of the invention can be a structure made of a conductive material. That is, the via 40 can be formed from a conductive material such that interlayer conduction is enabled over the entire via 40. In this embodiment, the conductive material forming the vias 40 can be a material containing copper (Cu).

Forming the vias 40 from a conductive material such as copper (Cu) can increase the heat-releasing effect of the vias. That is, the high levels of heat generated by electrical components, etc., mounted on the substrate may readily be released through the vias 40 made of a conductive material such as copper.

Also, as the vias 40 according to this embodiment can be made of a conductive material, problems in the related art of lowered reliability, due to the occurrence of voids and dimples in the vias when filling with an insulating resin, can be resolved.

Therefore, according to certain embodiments of the invention, the circuit patterns 32 and via lands 34 can be buried in the second insulation layers 20, as in the example shown in FIG. 10, while the via lands and the vias can be formed simultaneously as integrated structures during the procedure for forming the conductive material, so that the electrical reliability of the circuit patterns 32, via lands 34, and vias 40 can be improved, and the heat-releasing effect of the vias 40 can be enhanced.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

Many embodiments other than those set forth above can be found in the appended claims.

What is claimed is:

1. A method of manufacturing a printed circuit board having a circuit pattern and a via land formed therein, the method comprising:
    providing a first insulation layer;
    stacking a second insulation layer over the first insulation layer, the second insulation layer made of a photosensitive material;
    processing a via hole penetrating the first insulation layer and the second insulation layer by perforating through the first insulation layer and the second insulation layer by drilling;
    transcribing a contour of the circuit pattern and the via land into the second insulation layer, after processing the via hole; and
    forming a conductive material inside the contour of the circuit pattern and the via land and inside the via hole.

2. The method of claim 1, wherein the transcribing of the contour of the circuit pattern and the via land comprises:
    selectively exposing the second insulation layer to light; and
    selectively removing the second insulation layer by supplying a developer.

3. The method of claim 2, wherein the selective exposing of the second insulation layer to light comprises exposing a portion of the second insulation layer to light by stacking a mask over the second insulation layer.

4. The method of claim 1, wherein the forming of the conductive material inside the contour of the circuit pattern and the via land and inside the via hole comprises:
    forming a seed layer over the first insulation layer, the second insulation layer, and an inner wall of the via hole by electroless plating;
    forming the conductive material over the seed layer by electroplating; and
    etching the conductive material such that the second insulation layer is exposed.

5. The method of claim 4, wherein the etching of the conductive material comprises half-etching the conductive material by supplying an etchant.

6. The method of claim 4, wherein the etching of the conductive material comprises removing a portion of the conductive material by polishing.

* * * * *